United States Patent [19]

Steele et al.

[11] Patent Number: 5,498,578
[45] Date of Patent: Mar. 12, 1996

[54] METHOD FOR SELECTIVELY FORMING SEMICONDUCTOR REGIONS

[75] Inventors: John W. Steele, Chandler; Edouard de Frésart, Tempe; N. David Theodore, Mesa, all of Ariz.

[73] Assignee: Motorola, Inc., Schaumburg, Ill.

[21] Appl. No.: 236,054

[22] Filed: May 2, 1994

[51] Int. Cl.$^6$ ...................................... H01L 21/02
[52] U.S. Cl. .......................... 437/235; 437/238; 437/241; 437/244
[58] Field of Search ................................ 437/235, 238, 437/241, 244

[56] References Cited

U.S. PATENT DOCUMENTS

| | | | |
|---|---|---|---|
| 5,190,792 | 3/1993 | Blum et al. | 427/560 |
| 5,214,002 | 5/1993 | Hayashi et al. | 437/234 |
| 5,227,330 | 7/1993 | Agnello et al. | 437/108 |
| 5,242,530 | 9/1993 | Batey et al. | 156/613 |
| 5,378,651 | 1/1995 | Agnello et al. | 437/106 |

OTHER PUBLICATIONS

N. David Theodore et al., "Deterioration of Polysilicon/Gate–Oxide Structures upon H2 Annealing," Proc. 51st Annual Meeting of the Microscopy Society of America, Published by San Francisco Press, Inc., San Francisco, 1993, pp. 1110–1111.
S. T. Liu et al., "Reaction Kinetics of SiO2/Si(100) Interface in H2 Ambient in a Reduced Pressure Epitaxial Reactor," Electrochemical Society, 1987, pp. 428–435.
John O. Borland et al., "Advanced Dielectric Isolation through Selective Epitaxial Growth Techniques," Solid State Technology, Aug., 1985, pp. 141–148.
Kohetsu Tanno et al., "Selective Silicon Epitaxy Using Reduced Pressure Technique," Japanese Journal of Applied Physics, vol. 21, No. 9, Sep., 1982, pp. L564–L566.
Akihiko Ishitani et al., "Facet Formation in Selective Silicon Epitaxial Growth," Japanese Journal of Applied Physics, No. 10, Oct., 1983, pp. 1267–1269.

*Primary Examiner*—W. Robinson H. Clark
*Attorney, Agent, or Firm*—Kevin B. Jackson

[57] ABSTRACT

A method for selectively forming semiconductor regions (28) is provided, by exposing a patterned substrate (21) having exposed regions of semiconductor material (26,27) and exposed regions of oxide (24) to a first temperature and a semiconductor source-gas and hydrogen in an atmosphere substantially absent halogens, a blanket semiconductor layer (28,29) forms over the exposed regions of semiconductor material (26,27) and oxide (24). By further exposing the patterned substrate (21) to a second temperature higher than the first temperature in a hydrogen atmosphere, polycrystalline semiconductor material (29) formed over the exposed oxide regions (24) is selectively removed leaving that portion of the blanket semiconductor layer (28) over the exposed regions of semiconductor material (26,27). The method is suitable for forming isolated regions of semiconductor material for fabricating semiconductor devices and is not load dependent.

20 Claims, 4 Drawing Sheets

METHOD FOR SELECTIVELY FORMING SEMICONDUCTOR REGIONS

BACKGROUND OF THE INVENTION

This invention relates, in general, to semiconductor devices, and more particularly to a method for selectively forming semiconductor regions on semiconductor substrates.

Methods for selectively forming semiconductor regions have been reported in the past. For the selective deposition of silicon, typically a patterned semiconductor wafer having exposed oxide regions and exposed silicon regions is placed in a chemical vapor deposition (CVD) reactor and exposed to elevated temperature and a chlorine containing silicon source-gas ($SiCl_xH_y$) and hydrogen. Also, under certain conditions, hydrogen chloride (HCl) gas is used with the chlorine containing silicon source-gas and hydrogen.

In general, by controlling the temperature and pressure of the reactor and the concentrations of the chlorine and silicon sources, the process conditions are such that single-crystal silicon regions form in the exposed silicon regions. These conditions also prevent the build up of polysilicon on the exposed oxide region resulting in the selective formation of single-crystal silicon regions.

Another reported method involves using germane ($GeH_4$) in place of or in addition to HCl. Under appropriate process conditions, single-crystal silicon or single-crystal silicon-germanium regions form on the exposed silicon regions. The presence of germane competes with the silicon source for nucleation sites on the exposed oxide regions preventing silicon or silicon-germanium from forming on the exposed oxide regions.

These selective growth techniques have several problems. For example, both of the above techniques are sensitive to the ratio of exposed silicon to exposed oxide. This is often termed "load dependent" meaning that as the amount of exposed silicon on a semiconductor wafer increases thereby decreasing the amount of exposed oxide, the thickness uniformity of selectively formed silicon regions across the wafer decreases. Also, the above techniques are sensitive to the characteristics of the exposed passivation regions. Different passivation types such as atmospherically grown oxides, deposited oxides and deposited nitrides require the manufacturer to adjust and fine tune the selective epitaxial growth process parameters depending upon the types of passivation films present on the wafer. This significantly impacts manufacturing throughput and cost. In addition, the above techniques are susceptible to faceting defects.

Thus, a need exists for a selective epitaxial growth process that is not load dependent, that does not require a manufacturer to make process adjustments depending upon the type of exposed passivation layer present, and that is less susceptible to faceting defects.

SUMMARY OF THE INVENTION

Briefly stated, a method is provided for selectively forming semiconductor regions. A semiconductor substrate having exposed regions of semiconductor material and exposed regions of oxide is placed in a chemical vapor deposition (CVD) reactor. The substrate is exposed to a first temperature and a semiconductor source-gas and hydrogen in an atmosphere substantially absent halogens to form a blanket semiconductor layer over the exposed regions of semiconductor material and oxide. Polycrystalline semiconductor material forms over the exposed regions of oxide. The substrate is then exposed to a second temperature, higher than the first temperature, and hydrogen. During exposure to the second temperature and hydrogen, the polycrystalline semiconductor material formed over the exposed oxide regions is selectively removed leaving that portion of the blanket semiconductor layer formed over the exposed regions of semiconductor material.

DETAILED DESCRIPTION OF THE DRAWINGS

Generally, the present invention relates to a method for selectively forming semiconductor regions using chemical vapor deposition (CVD) techniques. The method is suitable for selectively forming semiconductor regions using semiconductor source-gases that are substantially absent halogens. The term substantially absent halogens means the presence of halogens in the source-gas is below trace amounts. Examples of such source-gases include silane, di-silane, and germane.

The method is used to selectively form semiconductor regions including silicon, silicon-germanium, carbon-doped silicon, or carbon-doped silicon-germanium for example. The selectively formed regions may be single-crystalline, amorphous or polycrystalline. In addition, the selectively formed regions may be doped p-type or n-type. Furthermore, the method is used to selectively form multiple layer structures. The method is suitable for forming isolated regions for fabricating semiconductor devices.

The present invention can be more fully described with reference to FIGS. 1–13. In a preferred embodiment of a method for selectively forming semiconductor regions, an atmospheric pressure chemical vapor deposition reactor (APCVD) or a reduced pressure chemical vapor deposition (RPCVD) reactor (hereinafter, CVD reactor) having the capability of rapid thermal ramp rates is provided as indicated by block 3 of the process flow diagram shown in FIG. 1. The CVD reactor includes a plurality of source-gas feed lines for hydrogen, the semiconductor source-gases, and dopant gases such as arsine, phosphine, and diborane. Individuals skilled in the art are aware of many suitable CVD reactors such as an ASM Epsilon 2e Rp, an Applied Materials 7810, and the like.

Figure 1:
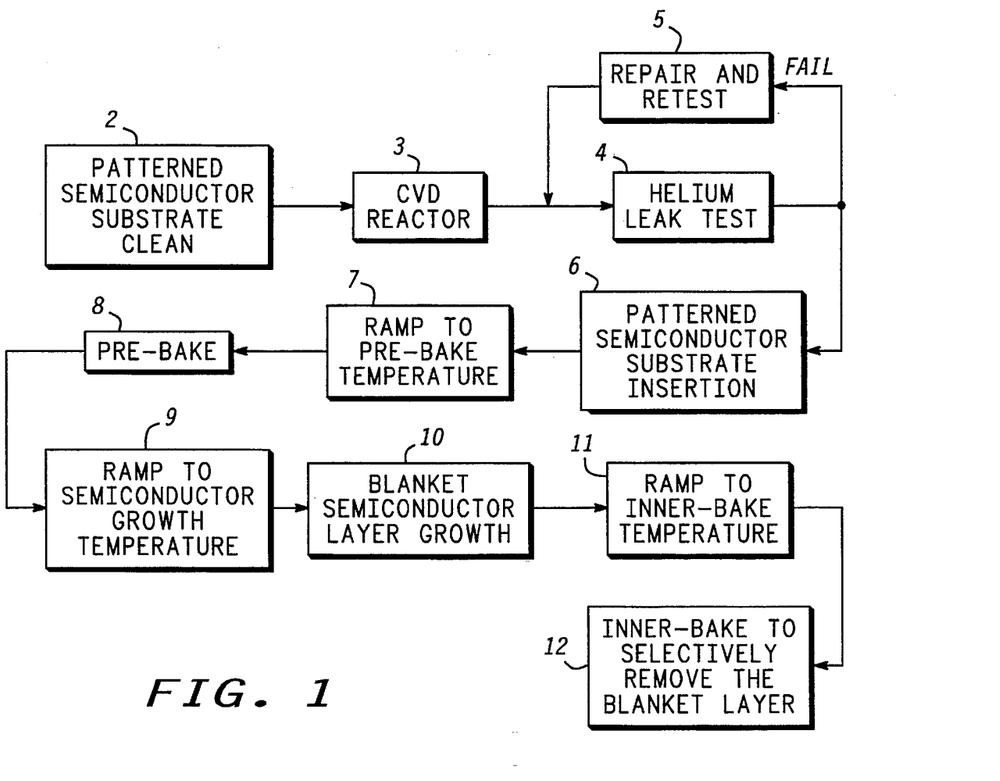
FIG. 1 illustrates a process flow diagram in accordance with the present invention.

To prepare the CVD reactor for chemical vapor deposition, a helium leak check is performed on the CVD reactor as shown by block 4 of FIG. 1. The CVD reactor must pass a helium leak check of less than approximately $1\times10^{-8}$ mm Hg. A CVD reactor that meets this requirement ensures that contaminants such as oxygen and water vapor do not enter the reactor and form an oxide layer on an exposed semiconductor substrate over which a blanket semiconductor layer will be formed. In addition, passing the helium leak check ensures that when highly reactive gases are used during processing, potential adverse reactions are avoided. A CVD reactor failing the helium leak test must be repaired and retested until it passes as indicated in the feedback portion (block 5) of FIG. 1. A CVD reactor that passes the helium leak test is called an ultra-clean reactor.

The helium leak check may be performed, for example, by connecting a turbo-helium leak detector to the CVD reactor, coating an exterior portion of the fittings connected to the reactor with helium, and checking for the presence of helium with the CVD reactor. Helium leak checks and procedures for performing helium leak checks are well known to those skilled in the art.

In a preferred embodiment, a patterned substrate having exposed regions of semiconductor material and passivation regions comprising exposed oxide is placed in a suitable CVD reactor chamber, for example, an ASM Epsilon 2e Rp. This procedure is illustrated in block 6 of FIG. 1. The passivation regions comprise an exposed oxide layer where the oxide preferably is either a thermal oxide or a densified deposited oxide. Alternatively, the passivation regions may further comprise a non-oxide layer under the exposed oxide layer such as a nitride layer, a high-temperature metal layer such as titanium, or a high-temperature metal-nitride layer such as titanium-nitride for example.

In addition, the semiconductor substrate may have multiple passivation regions comprised of exposed oxide layers and/or passivation regions comprised of exposed non-oxide layers such as exposed nitride layers. As will be explained below, the exposed oxide layer provides for the selective formation of semiconductor regions by the selective removal of deposited polycrystalline semiconductor material formed over the exposed oxide layer.

Preferably, the patterned substrate is cleaned, as shown in block 2 of FIG. 1, prior to placing it inside the CVD reactor chamber. In a preferred embodiment, the patterned substrate is cleaned in a bath comprising approximately 18:1 volumes of sulfuric acid ($H_2SO_4$):hydrogen peroxide ($H_2O_2$) at approximately 100 to 120° C. for 5 to 15 minutes, followed by a bath comprising approximately 50:1 volumes of $H_2O$:hydrofluoric acid (HF) at approximately 15 to 30° C. for 1 to 5 minutes. Next the patterned substrate is cleaned in a bath comprising approximately 2.5:2.5:12 volumes of Ammonia ($NH_4OH$):$H_2O_2$:$H_2O$ at approximately 45° C. to 65° C. for 8 to 12 minutes, followed by a bath comprising approximately 2.5:2.5:12 volumes of hydrochloric acid (HCl):$H_2O_2$:$H_2O_2$:$H_2O$ at approximately 40° to 60° C. for 8 to 12 minutes.

Alternatively, the patterned substrate is cleaned in-situ using, for example, a cluster tool apparatus that includes a chamber for cleaning a substrate that is separate from the CVD chamber. A gas such as hydrogen chloride gas may be used to clean the substrate and such cleaning techniques are well known to those skilled in the art.

After the patterned substrate is placed into the reactor chamber, the reactor temperature is increased, as shown in block 7 in FIG. 1, to a pre-bake temperature between 900° and 1000° C. using a temperature ramp rate of approximately 20° C./sec. When a reduced pressure CVD reactor is used, the reactor is pumped down to a pressure of approximately 40 to 80 torr prior to ramping the reactor to the pre-bake temperature. This pressure range is used throughout the process when a RPCVD reactor is used.

After the reactor has reached the pre-bake temperature, the patterned substrate is exposed to an atmosphere consisting essentially of hydrogen to reduce any native oxide present on the patterned substrate as a result of the pre-clean step. This process is shown as block 8 in FIG. 1. Preferably, the pre-bake atmosphere consists essentially of hydrogen and the patterned substrate is exposed to the pre-bake temperature and hydrogen atmosphere for approximately 5 minutes with a hydrogen flow-rate of approximately 20 to 200 standard liters per minute (slm). In a preferred embodiment, the hydrogen flow-rate is approximately 100 slm.

After the pre-bake step, the CVD reactor is reduced to the semiconductor layer growth temperature of between 650° and 850° C. as represented by block 9 in FIG. 1. Preferably, a ramp rate of approximately −10° C./second is used. A preferred growth temperature is between 750° and 800° C. While the reactor is ramping to the growth temperature, the semiconductor source-gas lines are purged with hydrogen.

Once the reactor chamber has reached the growth temperature and the semiconductor source-gas lines are purged, the semiconductor source-gas is introduced into the reactor chamber along with a hydrogen carrier gas having a flow-rate of approximately 20 to 200 slm with a flow-rate of 100 slm preferred. During the growth step, the atmosphere in the reactor is substantially absent the presence of halogens. Under these conditions, a blanket semiconductor film or layer is formed over the patterned semiconductor substrate as represented by block 10 of FIG. 1. Because a blanket layer is formed, the process is not load dependent, it is less sensitive to the characteristics of the exposed passivation regions, and it is less susceptible to faceting defects.

The blanket semiconductor layer comprises polycrystalline semiconductor material over the exposed oxide layer. In addition, when the patterned substrate also comprises exposed non-oxide layers such as silicon nitride, polycrystalline semiconductor material forms over the non-oxide layer. The blanket semiconductor layer further comprises single-crystal semiconductor material where the exposed semiconductor material on the patterned substrate is single-crystal semiconductor material. With a silane semiconductor source-gas, a growth temperature of approximately 750° C., and a silane flow-rate of approximately 5 slm, a growth rate of approximately 0.04 microns/minute is achieved. In addition, when a silane source-gas is used, preferably a 2% silane in hydrogen source-gas is used having a purity of 99.99999%.

In a preferred embodiment, gas purifying filters are attached to all gas lines in order to provide ultra-dry gases and an atmosphere within the reactor chamber that is substantially absent moisture. Preferably the gas line purifying filters result in less than $5 \times 10^{18}$ atoms/cm$^3$ of oxygen in the blanket semiconductor layer as measured using a secondary ion mass-spectrometer technique. Examples of such gas purifying filters include the Nanochem® Hydrogen 3000, Nitrogen 1400, and Silane IV available from Semigas Systems Inc.

During the formation of the blanket semiconductor layer, dopants such as boron, phosphorus, or arsenic may be introduced into the blanket layer by using dopant source-gases such as diborane, phosphine, or arsine. In addition, the blanket semiconductor layer may be doped with germanium using a germane source-gas and/or carbon using a propane source-gas to provide for bandgap engineered devices. When germane is used to form germanium doped silicon devices, the germane concentration is kept below $5.0 \times 10^{20}$ atoms/cm$^3$ to prevent selectivity of the polycrystalline material as the blanket semiconductor layer is formed.

Once the blanket semiconductor layer reaches the desired thickness, the semiconductor source-gas and any dopant gases are shut off from the reactor chamber and the reactor chamber and gas lines are purged with hydrogen for approximately 2 minutes. While the reactor chamber and gas lines are under purge, the reactor chamber temperature is increased to an inner-bake temperature between 900° and 1200° C. using a temperature ramp rate of approximately 20° C./second as represented by block 11 in FIG. 1. During the inner-bake step, as represented by block 12 of FIG. 1, hydrogen flows into the reactor chamber at flow-rate between 20 and 200 slm with a flow-rate of 100 slm preferred.

By exposing the patterned substrate to an elevated temperature and hydrogen, the polycrystalline semiconductor material portion of the blanket layer over the previously exposed oxide layer is selectively removed leaving a remaining portion of the blanket layer that is single-crystal semiconductor material. Also, a portion of the underlying previously exposed oxide layer is removed in an amount dependent upon, among other things, time, temperature, and characteristics of the exposed oxide layer. In addition, that portion of the blanket layer that is over an exposed non-oxide layer, such as silicon nitride, is not removed. Preferably, the atmosphere in the CVD reactor during the inner-bake step consists essentially of hydrogen.

Preferably, the patterned substrate is exposed to a temperature of approximately 1100° C. for an amount of time sufficient to remove the polycrystalline semiconductor material over the exposed oxide layer. It has been determined that approximately 10 seconds at approximately 1100° C. is sufficient to remove approximately 1000 angstroms of polycrystalline semiconductor material and approximately 5000 angstroms of exposed oxide under the polycrystalline semiconductor material.

It is believed that the selective removal of the polycrystalline semiconductor material and the exposed oxide layer under the polycrystalline material results from a series of reaction steps including the surface adsorption of hydrogen on the polysilicon, the surface dissociation of hydrogen, the surface diffusion of hydrogen to the interface between the polycrystalline material and the exposed oxide, the surface reduction of silicon to produce adsorbed silicon, and the reaction of adsorbed silicon with the exposed oxide to produce volatile silicon oxide (SiO).

In an alternative embodiment, the patterned substrate is removed from the CVD reactor chamber after the blanket semiconductor layer is grown. The patterned wafer is then exposed to the elevated temperature and hydrogen using a thermal anneal system capable of providing rapid thermal ramp rates and a hydrogen atmosphere. An example of such a rapid thermal anneal system is an AST SHS2000. However, it is preferred that both the growth step and the inner-bake step take place in-situ within a CVD reactor to minimize manufacturing costs and capital investment. In addition, the in-situ process reduces the exposure of the substrate to particulates and contamination associated with, among other things, excessive substrate handling.

Figure 2:
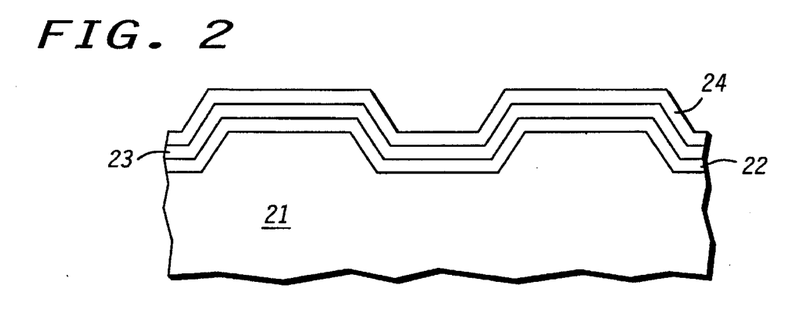
FIGS. 2–5 illustrate highly enlarged cross-sectional views of one embodiment according to the present invention.

FIGS. 2–5 provide cross-sectional views of an example of a process to selectively form semiconductor regions by selective removal of polycrystalline semiconductor material and exposed oxide, according to the present invention. FIG. 2 illustrates a cross-sectional view of a semiconductor substrate 21 having an oxide layer 22, a non-oxide layer 23, and an exposed oxide layer 24 formed thereon at a stage of fabrication. Non-oxide layer 23 comprises a nitride layer for example.

Figure 3:
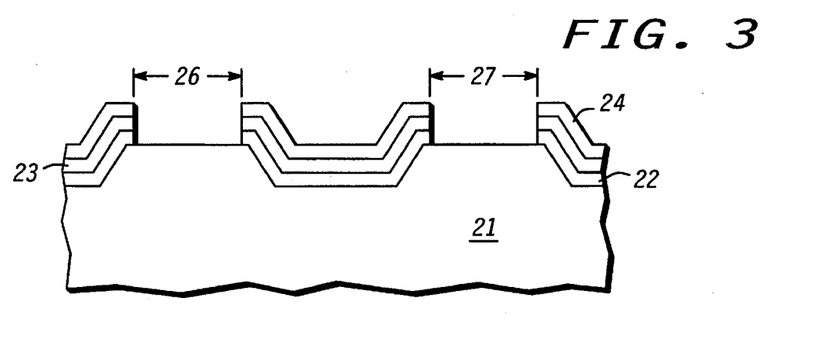

FIG. 3 shows semiconductor substrate 21 at a later stage of fabrication after standard photolithography techniques are used to form openings 26 and 27. Openings 26 and 27 expose portions of semiconductor substrate 21. After openings 26 and 27 are formed, substrate 21 is cleaned using the techniques described with block 2 of FIG. 1. After substrate 21 is cleaned, it is placed into a CVD reactor that passes the helium leak test as described with blocks 3–6 of FIG. 1.

Figure 4:
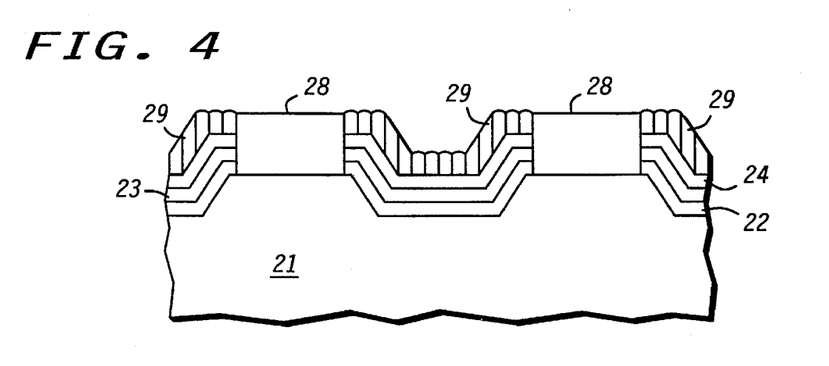
Figure 5:
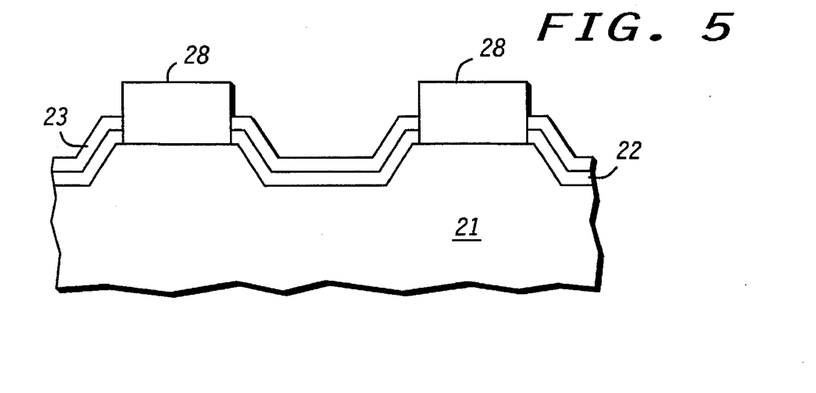

FIG. 4 shows substrate 21 after a blanket layer is grown on substrate 21 as described with block 10 of FIG. 1. The blanket layer has single-crystal semiconductor regions 28 formed in openings 26 and 27 and polycrystalline regions 29 formed over exposed oxide layer 24. After the blanket layer is formed on substrate 21, substrate 21 is exposed to the high temperature and hydrogen atmosphere, as described with block 12 of FIG. 1, to selectively remove polycrystalline regions 29 and exposed oxide layer 24 leaving single-crystal semiconductor material regions 28, non-oxide layer 23, and oxide layer 22 on substrate 21 as shown in FIG. 5. The thickness of exposed oxide layer 24 is selected such that all or only a portion of exposed oxide layer 24 is removed during the inner-bake step.

Figure 6:
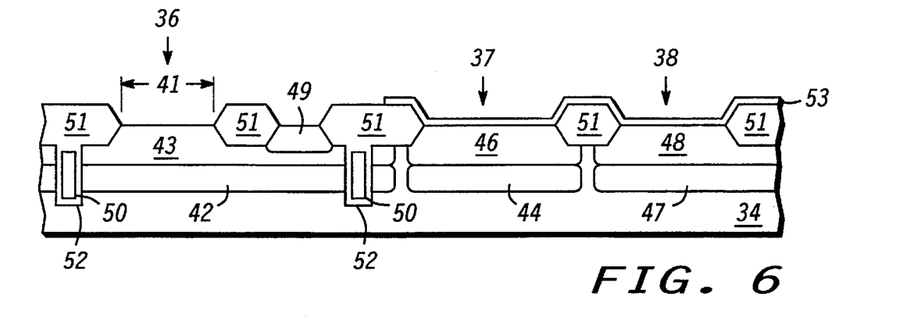
FIGS. 6–13 illustrate highly enlarge cross-sectional views of a second embodiment according to the present invention.

FIGS. 6–13 illustrate highly enlarged cross-sectional views of a second example of a process according to the present invention. The second example uses the present invention during the fabrication of a bipolar-complementary metal-oxide semiconductor (BICMOS) device. FIG. 6 shows a cross-sectional view of a semiconductor substrate 34 having an NPN bipolar device region 36, an N-MOS device region 37, and a P-MOS device region 38 at an interim step of fabrication. Preferably, substrate 34 comprises single-crystal silicon. It is understood that dopant configuration is shown as an example only and that others are possible.

In the embodiment shown, substrate 34 is a p-type substrate having a doping concentration on the order of 2.0 to $7.0 \times 10^{15}$ atoms/cm$^3$. Bipolar device region 36, NMOS device region 37, and P-MOS device region 38 are passivated using passivation regions 51. Passivation regions 51 preferably comprise a silicon oxide, and are commonly referred to as field oxide. Methods for forming passivation regions 51 are well known in the art. Trench isolations 52 further isolate bipolar device region 36 from N-MOS device region 37 and P-MOS device region 38. Optionally, trench isolation 52 includes a polycrystalline semiconductor region 50. Polycrystalline semiconductor region 50 provides stress relieved refill for trench isolations 52. Methods for forming trench isolations 52 are well known in the art.

Bipolar device region 36 comprises an n-type buried layer region 42 having a doping concentration on the order of 0.5 to $1.0 \times 10^{19}$ atoms/cm$^3$, an n-type collector region 43 having a doping concentration of 0.5 to $1.0 \times 10^{16}$ atoms/cm$^3$, and an n-type deep contact region 49 having a dopant concentration on the order of 0.5 to $1.0 \times 10^{19}$ atoms/cm$^3$. It is understood that other dopant ranges are applicable, depending upon the particular device requirements. Opening 41 provides access to n-type collector region 43 for later forming base and emitter regions. Methods for forming opening 41 are well known in the art.

N-MOS region 37 comprises a p-type buried layer 44 having a dopant concentration on the order of 0.1 to $1.0 \times 10^{19}$ atoms/cm$^3$ and a p-type well region 46 having a dopant concentration on the order of 0.5 to $5.0 \times 10^{16}$ atoms/cm$^3$. P-MOS region 38 comprises an n-type buried layer 47 having a dopant concentration on the order of 0.5 to $1.0 \times 10^{19}$ atoms/cm$^3$ and an n-type well region 48 having a dopant concentration on the order of $5.0 \times 10^{13}$ to $1.0 \times 10^{15}$ atoms/cm$^3$. It is understood that other dopant ranges are applicable, depending upon the particular device requirements. Methods for forming n-type buried layer 42, n-type collector region 43, n-type deep contact 49, p-type buried layer 44, p-type well 46, n-type buried layer 47, and n-type well region 48 are well known in the art.

Substrate 34 further has patterned passivation layer 53 over N-MOS region 37 and P-MOS region 38. Preferably passivation layer 53 comprises an oxide and is on the order of 200 to 1000 angstroms thick. Patterned passivation layer 53 protects N-MOS region 37 and P-MOS region 38 during subsequent processing to bipolar device region 36. In addition, patterned passivation layer 53 may act as a sacrificial gate oxide. Methods for forming patterned passivation layer 53 are well known in the art.

Figure 7:
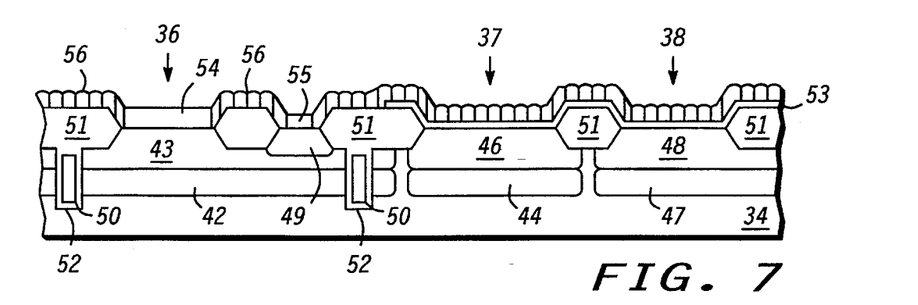

FIG. 7 shows substrate 34 at a later step in fabrication. A blanket layer comprising polysilicon regions 56 and single-crystal silicon regions 54 and 55 is formed over the surface of substrate 34. The blanket layer is formed preferably using the process set forth with blocks 2–10 of FIG. 1. Preferably, the blanket layer is not doped. If the blanket layer is doped, it is doped with boron at a dopant concentration of 1.0 to $5.0 \times 10^{16}$ atoms/cm$^3$ when bipolar device region 36 comprises an NPN transistor. Single-crystal silicon region 54 acts as a buffer layer between n-type collector region 43 and base region 64, shown in FIG. 10, to account for dopant movement during subsequent high temperature processes. When the blanket layer is lightly doped with boron, the concentration of n-type deep contact 49 must be high enough to compensate for the p-type dopant in silicon region 55 during subsequent high temperature processing. Optionally, n-type deep contact 49 is covered with an oxide during the blanket layer deposition and polysilicon regions 56 extend over the oxide above n-type deep contact 49.

Figure 8:
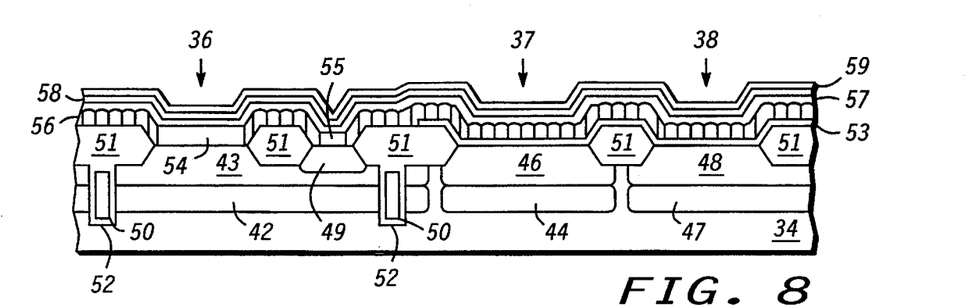

FIG. 8 shows substrate 34 at a later step in fabrication. A series of passivation layers are formed over the blanket layer, the series of passivation layers preferably comprises silicon oxide layer 57, silicon nitride layer 58 and silicon oxide layer 59. Silicon oxide layer 57 is on the order of 100 to 200 angstroms thick, silicon nitride layer 58 is on the order of 500 to 1500 angstroms thick, and silicon oxide layer 59 is on the order of 100 to 3000 angstroms thick. Preferably, silicon oxide layer 57 is formed using low pressure chemical vapor deposition (LPCVD) and a tetraethylorthosilicate (TEOS) source, silicon nitride layer 58 is formed using either plasma enhanced CVD (PECVD) or LPCVD, and silicon oxide layer 59 is formed using LPCVD TEOS.

Figure 9:
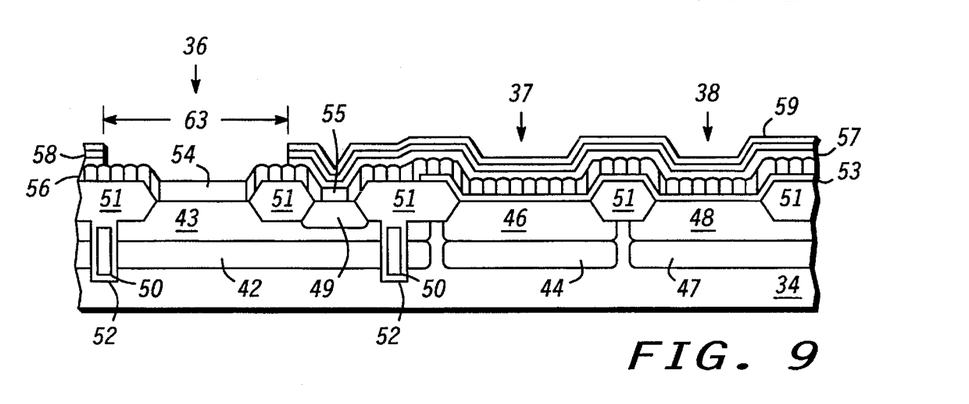

As shown in FIG. 9, an opening 63 is formed through a portion of silicon oxide layer 59, silicon nitride layer 58, and silicon oxide layer 57 to provide access to a portion of bipolar device region 36. Methods for forming opening 63 through silicon oxide layer 59, silicon nitride layer 58, and silicon oxide layer 57 are well known in the art.

Figure 10:
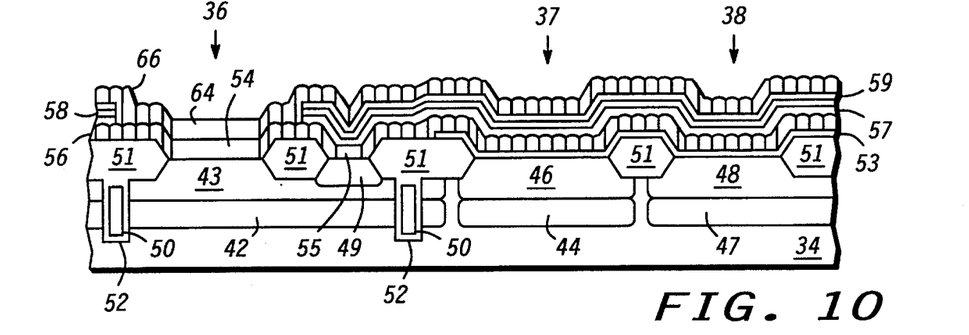

As shown in FIG. 10, after opening 63 is formed, a blanket layer comprising polysilicon region 66 and single-crystal silicon region 64 is formed using the process set forth with blocks 2-10 of FIG. 1. Preferably, the blanket layer is doped with boron having a dopant concentration on the order of $5.0 \times 10^{16}$ to $5.0 \times 10^{19}$ atoms/cm$^3$ when bipolar region 36 is designed for an NPN transistor. Single-crystal silicon region 64 forms a remaining portion of the base of bipolar device region 36. Optionally, the blanket layer comprising regions 66 and 64 is doped with germanium to provide a heterojunction device.

Figure 11:
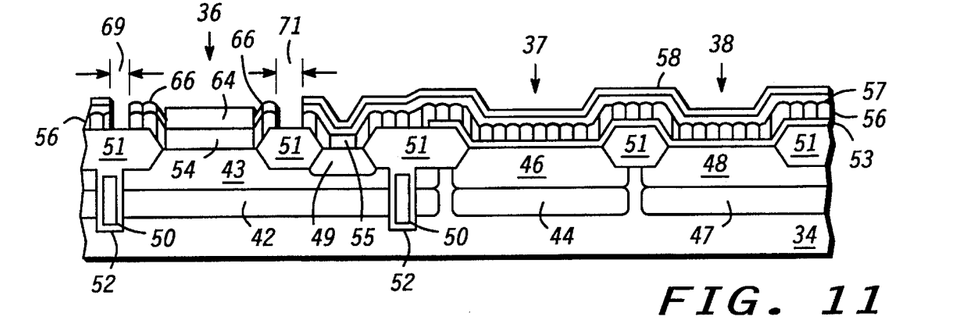

As shown in FIG. 11, after the blanket layer comprising polysilicon region 66 and single-crystal silicon region 64 is formed, substrate 34 is exposed to high temperature and a hydrogen atmosphere as shown with block 12 of FIG. 1 to selectively remove portions of polysilicon layer 66 and polysilicon layer 56. Also, the exposure of substrate 34 to the high temperature and hydrogen atmosphere removes oxide layer 59 but not silicon nitride layer 58. In addition, exposure of substrate 34 to the high temperature and hydrogen atmosphere together with oxide from silicon oxide layer 57 and oxide layers 51 adjacent to single-crystal silicon regions 54 and 64 provide for the formation of openings 69 and 71 through polysilicon layers 66 and 56.

Figure 12:
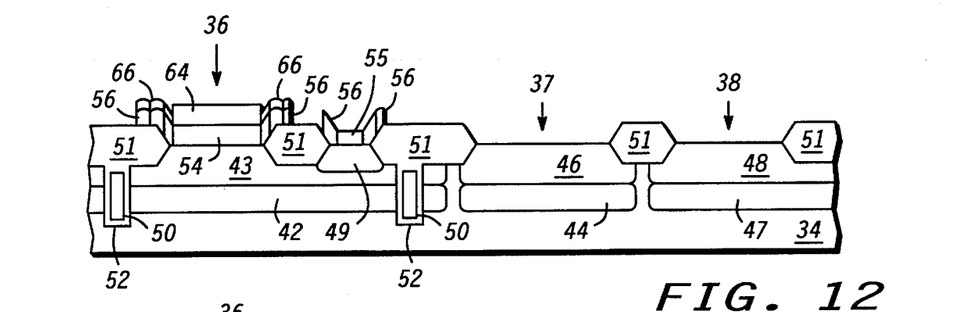

FIG. 12 shows substrate 34 at a later step in fabrication. Standard photolithography and etch processes are used to remove silicon nitride layer 58, silicon oxide layer 57, portions of polysilicon region 56, and oxide layer 53.

Figure 13:
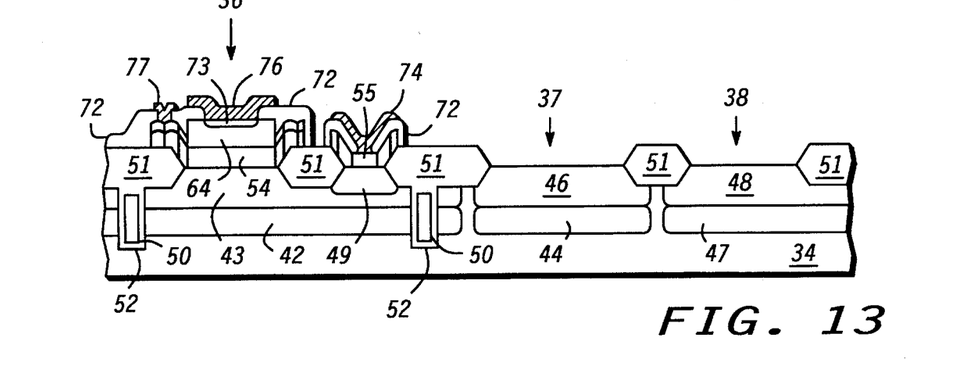

FIG. 13 shows bipolar device region 36 having a completed bipolar device. Oxide layer 72 is formed over the entire surface of substrate 34. Oxide layer 72 preferably comprises silicon oxide formed using LPCVD TEOS. Oxide layer 72 is patterned to allow the formation of emitter region 73. Methods for patterning oxide layer 72 and forming emitter region 73 are well known in the art. Oxide layer 72 is further patterned and contact layers 74, 76, and 77 are formed providing contact to n-type collector region 43, emitter region 73, and base regions 54 and 64 respectively. Preferably, contact layers 74, 76, and 77 comprise doped polysilicon. Methods for forming contact layers 74, 76, and 77 are well known in the art. Field effect transistor (FET) devices are then formed in N-MOS region 37 and P-MOS region in a conventional manner. Optionally, the FET devices are fabricated prior to the formation of contact layers 74, 76, and 77.

By now, it should be appreciated that there has been provided a method for selectively forming semiconductor regions. By exposing a patterned substrate having exposed regions of semiconductor material and exposed regions of oxide to a first temperature and a semiconductor source-gas and hydrogen in an atmosphere substantially absent halogens, a blanket semiconductor layer forms over the exposed regions of semiconductor material. The absence of halogens provides for the formation of the blanket semiconductor layer. Polycrystalline semiconductor material forms over the exposed regions of oxide. By further exposing the patterned substrate to a second temperature higher than the first temperature in a hydrogen atmosphere, the polycrystalline semiconductor material formed over the exposed oxide regions and the exposed oxide regions are selectively removed leaving that portion of the blanket semiconductor layer over the exposed regions of semiconductor material. Because the method uses the formation of a blanket semiconductor layer, the method is not load dependent, it does not require a manufacturer to make process adjustments depending upon the type of exposed passivation layer present, and it is less susceptible to faceting defects.

We claim:

1. A method for selectively forming semiconductor regions comprising the steps of:

forming a blanket semiconductor layer on a substrate having a first region of exposed semiconductor material and a second region of exposed oxide, wherein the blanket semiconductor laver is formed over the exposed semiconductor material and the exposed oxide, and wherein the blanket semiconductor layer formed over the exposed oxide comprises polycrystalline semiconductor material; and thereafter exposing the substrate to an elevated temperature in a range from about 900° C. to about 1200° C. and hydrogen to selectively remove the polycrystalline semiconductor material formed over the exposed oxide while leaving a remaining portion of the blanket semiconductor layer formed over the exposed semiconductor material.

2. The method of claim 1 wherein the step of forming the blanket semiconductor layer includes exposing the substrate to a semiconductor source gas and hydrogen in an atmosphere substantially absent halogens and at a growth temperature in range from about 650° C. to about 850° C.

3. The method of claim 1 further comprising the step of exposing the substrate to a pre-bake temperature in a range from about 900° C. to about 1000° C. in an atmosphere consisting essentially of hydrogen prior to the step of forming the blanket semiconductor layer.

4. The method of claim 1 wherein the step of forming the blanket semiconductor layer includes exposing the substrate to silane and hydrogen in an atmosphere substantially absent halogens and substantially absent moisture at a growth temperature in range from about 750° C. to about 800° C.

5. The method of claim 1 wherein the steps of forming the blanket semiconductor layer and exposing the substrate to the elevated temperature and hydrogen are done in a CVD reactor without intermediate exposure of the substrate to an ambient outside of the CVD reactor.

6. The method of claim 1 wherein the step of exposing the substrate to the elevated temperature and hydrogen is done in a rapid thermal anneal system.

7. The method of claim 1 wherein the step of placing the substrate into the CVD reactor comprises placing the substrate into an RPCVD reactor having a reduced pressure between 40 and 80 torr.

8. A process for selectively forming silicon regions comprising the steps of:

placing a substrate having a first region comprised of exposed silicon and a second region comprised of an exposed oxide layer into a CVD reactor exposing the substrate to a first atmosphere consisting essentially of hydrogen;

exposing the substrate to a second atmosphere comprising a silane source-gas and hydrogen at a growth temperature in a range from about 650° C. to about 850° C. to form a blanket silicon layer over the exposed silicon and the exposed oxide layer, wherein the blanket silicon layer over the exposed oxide layer comprises polysilicon, and wherein the second atmosphere is substantially absent halogens; and exposing the substrate to a third atmosphere consisting essentially of hydrogen at an inner-bake temperature in range from about 900° C. to about 1200° C. to selectively remove the polysilicon over the exposed oxide layer while leaving a remaining portion of the blanket silicon layer formed over the exposed silicon.

9. The process of claim 8 further comprising the steps of:

exposing the substrate to a bath comprising approximately 18:1 volumes of $H_2SO_4:H_2O_2$ at approximately 100° to 120° C. for 5 to 15 minutes;

exposing the substrate to a bath comprising approximately 50:1 volumes of $H_2O_2$:HF at approximately 15° to 30° C. for 1 to 5 minutes;

exposing the substrate to a bath comprising approximately 2.5:2.5:12 by volume of $NH_4OH:H_2O_2:H_2O$ at approximately 45° to 65° C. for 8 to 12 minutes; and exposing the substrate to a bath comprising approximately 2.5:2.5:12 volumes of $HCl:H_2O_2:H_2O$ at approximately 40° to 60° C. for 8 to 12 minutes prior to the step of placing the substrate into the CVD reactor.

10. The process of claim 8 wherein the step of placing the substrate into the CVD reactor comprises placing a substrate having a first region comprising exposed silicon and a second region comprising an exposed oxide layer and a non-oxide layer between the substrate and the exposed oxide layer into the CVD reactor, and wherein the step of exposing the substrate to the third atmosphere comprises exposing the substrate to the third atmosphere to remove the polysilicon over the exposed oxide layer and to remove the exposed oxide layer while leaving the non-oxide layer.

11. The process of claim 8 wherein the step of placing the substrate into the CVD reactor comprises placing a substrate having a first region comprising exposed single-crystal silicon and exposed polysilicon adjacent to the exposed single-crystal silicon, and a second region comprising exposed silicon oxide adjacent to the exposed polysilicon into the CVD reactor, and wherein the step of exposing the substrate to the second atmosphere forms the blanket silicon layer over the exposed silicon crystal silicon, the exposed polysilicon, and the exposed silicon oxide, wherein the blanket silicon layer comprises single-crystal silicon over the exposed single-crystal silicon and comprises polysilicon over the exposed polysilicon and the exposed silicon oxide, and wherein the step of exposing the substrate to the third atmosphere selectively removes a portion of the blanket layer formed over the exposed polysilicon, a portion of the exposed polysilicon adjacent to the exposed silicon oxide to form an opening between the exposed silicon oxide and the exposed polysilicon, the polysilicon over the exposed silicon oxide, and the exposed silicon oxide, while leaving a remaining portion of the blanket layer formed over the exposed polysilicon adjacent to the single-crystal silicon, a remaining portion of the exposed polysilicon adjacent to the exposed single-crystal silicon, and the single-crystal silicon formed over the exposed single-crystal silicon.

12. A method for selectively forming isolated single-crystal semiconductor regions comprising the steps of:

providing a silicon substrate;

forming a non-oxide layer over a surface of the silicon substrate;

forming an oxide layer over the non-oxide layer;

patterning the oxide layer to expose the non-oxide layer;

patterning the non-oxide layer to form at least one exposed silicon region of the silicon substrate;

placing the silicon substrate into a CVD reactor chamber;

exposing the silicon substrate to an ambient comprising a silane source-gas and hydrogen at a first temperature in a range from about 650° C. to about 850° C. to form a blanket silicon layer over the at last one exposed silicon region and the oxide layer, wherein the blanket silicon layer over the at least one exposed silicon region comprises single-crystal silicon and the blanket silicon layer over the oxide layer comprises polysilicon, and wherein the CVD ractor chamber is substantially absent halogens during formation of the blanket silicon layer; and exposing the substrate to a second temperature in a range from about 900° C. to about 1200° C. and hydrogen for a time sufficient to selectively remove the polysilicon over the oxide layer and to remove the oxide layer while leaving that portion of the blanket silicon layer comprising the single-crystal silicon and leaving the non-oxide layer under the oxide layer.

13. The method of claim 12 wherein the step of forming a non-oxide layer comprises forming a silicon nitride layer.

14. The method of claim 13 further comprising the steps of:

forming an oxide layer over the surface of the substrate before the step of forming the non-oxide layer; and patterning the oxide layer over the surface of the substrate to expose the at least one silicon region of the substrate after the step of patterning the non-oxide layer.

15. The method of claim 12 wherein the step of forming a non-oxide layer comprises forming a high-temperature metal layer.

16. The method of claim 12 wherein the step of forming a non-oxide layer comprises forming a high-temperature metal-nitride layer.

17. The process of claim 12 further comprising the steps of:

exposing the substrate to a bath comprising approximately 18:1 volumes of $H_2SO_4:H_2O_2$ at approximately 100° to 120° C. for 5 to 15 minutes;

exposing the substrate to a bath comprising approximately 50:1 volumes of $H_2O:HF$ at approximately 15° to 30° C. for 1 to 5 minutes;

exposing the substrate to a bath comprising approximately 2.5:2.5:12 by volume of $NH_4OH:H_2O_2:H_2O$ at approximately 45° to 55° C. for 8 to 12 minutes; and exposing the substrate to a bath comprising approximately 2.5:2.5:12 volumes of $HCl:H_2O_2:H_2O$ at approximately 40° to 60° C. for 8 to 12 minutes before the step of placing the silicon substrate into the CVD reactor.

18. The process of claim 12 wherein the step of exposing the silicon substrate to the ambient comprising the silane source-gas and hydrogen comprises exposing the silicon substrate to the silane source-gas, a germanium source-gas, and hydrogen to form a blanket semiconductor layer over the at least one exposed silicon region and the oxide layer, wherein the blanket semiconductor layer over the at least one exposed silicon region comprises germanium doped single-crystal silicon and the blanket semiconductor layer over the oxide layer comprises germanium doped polysilicon, and wherein germanium is present in the CVD reactor chamber at a concentration sufficient to prevent selectivity of the germanium doped polysilicon as the blanket semiconductor layer is formed.

19. The method of claim 12 further comprising the step of exposing the substrate to a pre-bake temperature in range from about 900° C. to about 1000° C. and hydrogen prior to the step of exposing the substrate to the ambient comprising a silane source-gas and hydrogen.

20. The method of claim 1 wherein the step of forming the blanket semiconductor layer includes forming a germanium doped silicon layer.

* * * * *

UNITED STATES PATENT AND TRADEMARK OFFICE
CERTIFICATE OF CORRECTION

PATENT NO. : 5,498,578            Page 1 of 2
DATED : March 12, 1996
INVENTOR(S) : John W. Steele
               Edouard deFresart
               N. David Theodore It is certified that error appears in the above-indentified patent and that said Letters Patent is hereby corrected as shown below:

Claim 1, column 8, line 53
Delete "laver" and insert --layer-- therefor.

Claim 3, column 9, line 8
Delete "laver" and insert --layer-- therefor.

Claim 5, column 9, line 16
Delete "CVD" and insert --chemical vapor deposition (CVD)-- therefor.

Claim 7, column 9, line 24,
Delete "RPCVD" and insert --reduced pressure chemical vapor deposition (RPCVD)-- therefor.

Claim 8, column 9, line 30
Insert --;-- after "reactor".

Claim 12, column 10, line 49,
Delete "last" and insert --least-- therefor.

UNITED STATES PATENT AND TRADEMARK OFFICE
CERTIFICATE OF CORRECTION

PATENT NO. : 5,498,578  
DATED : March 12, 1996  
INVENTOR(S) : John W. Steele  
Edouard deFresart  
N. David Theodore Page 2 of 2

It is certified that error appears in the above-indentified patent and that said Letters Patent is hereby corrected as shown below:

Claim 12, column 10, line 54,
Delete "ractor" and insert --reactor-- therefor.

Signed and Sealed this

Fourth Day of November, 1997

Attest:

BRUCE LEHMAN

Attesting Officer  Commissioner of Patents and Trademarks